United States Patent [19]
Miyoshi et al.

[11] 3,998,672
[45] Dec. 21, 1976

[54] METHOD OF PRODUCING INFRARED LUMINESCENT DIODES

[75] Inventors: Tadahiko Miyoshi, Hitachi; Yasutoshi Kurihara, Katsuta; Mitsuru Ura, Hitachi, all of Japan

[73] Assignee: Hitachi, Ltd., Japan

[22] Filed: Dec. 30, 1975

[21] Appl. No.: 645,328

[30] Foreign Application Priority Data

Jan. 8, 1975    Japan ............................ 50-4430

[52] U.S. Cl. .......................... 148/171; 148/172; 148/33.5; 29/580; 357/17; 156/17; 252/62.3 GA
[51] Int. Cl.² ...................................... H01L 21/208
[58] Field of Search ............... 148/171, 172, 175; 29/580; 357/17; 156/17; 252/62.3 GA, DIG. 11

[56] References Cited
UNITED STATES PATENTS

| | | | |
|---|---|---|---|
| 3,647,578 | 3/1972 | Barnett et al. ............... | 148/171 |
| 3,740,276 | 6/1973 | Bean ............................ | 148/175 |
| 3,764,409 | 10/1973 | Nomura et al. ............... | 148/175 |
| 3,783,351 | 1/1974 | Tsukada et al. ............... | 148/171 X |
| 3,793,712 | 2/1974 | Bean et al. ..................... | 29/580 |
| 3,813,585 | 5/1974 | Tarui et al. ..................... | 357/15 X |
| 3,832,225 | 8/1974 | Matsui et al. .................. | 427/86 |
| 3,849,790 | 11/1974 | Gottsmann et al. ............. | 357/18 |

*Primary Examiner*—G. Ozaki
*Attorney, Agent, or Firm*—Craig & Antonelli

[57] ABSTRACT

A recess is formed in one of the principal surfaces of an N-type substrate of GaAs. Through the liquid phase growth technique, a silicon-doped N-type GaAs layer is formed on the one of the principal surfaces and on the surface of the recess and a silicon-doped P-type GaAs layer is continuously formed on the N-type GaAs layer. The liquid-phase-grown GaAs layers are so cut that the PN junction between the layers may be exposed on a plane.

5 Claims, 15 Drawing Figures

FIG.9
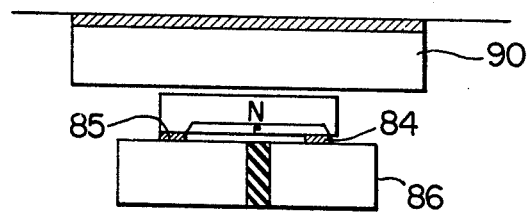
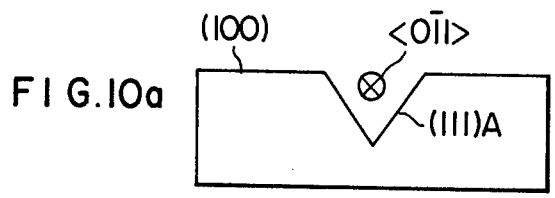
FIG.10a
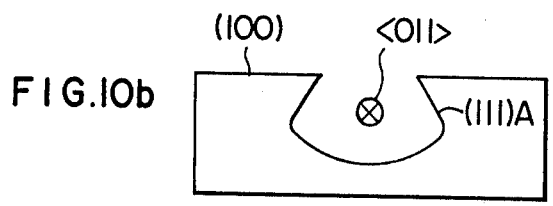
FIG.10b
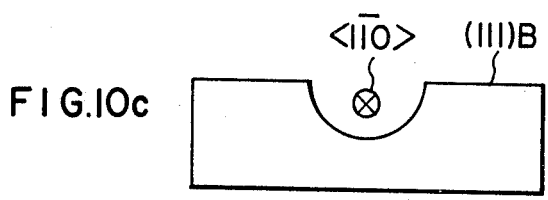
FIG.10c

METHOD OF PRODUCING INFRARED LUMINESCENT DIODES

BACKGROUND OF THE INVENTION

1. FIELD OF THE INVENTION

The present invention relates to a method of producing an infrared luminescent diode using GaAs, of the so-called planar type in which a portion or the whole of the edge of the PN junction is exposed in one of the principal surfaces of the substrate.

2. DESCRIPTION OF THE PRIOR ART

Infrared luminescent diodes (hereafter referred to as GaAs LED) using silicon-doped (hereafter referred to as "Si-dopped") gallium arsenide are widely applied in such devices as photocouplers and display elements using the conversion of infrared rays to visible light since they have various advantages: low operating voltages of 1–2 volts, high luminescent efficiency of 3–5%, small size with long life, and facility in fabrication with a PN junction formed by a single process of liquid growth. The Si-doped GaAs LED of this conventional type has been fabricated by forming a Si-doped N-type GaAs layer having a thickness of 5–20 $\mu$ on one of the principal surfaces of an N-type GaAs substrate and further by forming on the N-type GaAs layer a Si-doped P-type GaAs layer having a thickness of 50–100 $\mu$, through the liquid phase growth techniques. FIG. 1 shows a GaAs LED fabricated according to this method. In FIG. 1 reference numeral 1 indicates an N-type GaAs substrate, 2 an N-type GaAs layer, 3 a P-type GaAs layer, and 4 and 5 a pair of main electrodes in ohmic contact respectively with the substrate 1 and the layer 3. With this structure in which the main electrodes are attached on the opposite surfaces, the connection of these electrodes with other terminals cannot resort to the face-down bonding and the connection of at least one of the electrodes must be performed through wire bonding or the beam lead bonding techniques. Accordingly, the fabrication of such a GaAs LED is rather laborious and has a poor mass-producibility, the mechanical strength and the reliability of the thus formed GaAs LED are insufficient, and the connection of the GaAs LED with the light receiving element of photocouplers becomes complicated. In order to eliminate these drawbacks, the selective diffusion, the ion implantation or the epitaxial growth techniques for rendering the GaAs LED in the planar configuration, have been proposed. However, since the GaAs LED obtained through the diffusion and/or the ion implantation usually has a Zn-doped P-type layer, it has a lower luminescent efficiency than the Si-doped GaAs LED. On the other hand, according to the selective epitaxial growth technique, in which a recess is formed in the surface of a GaAs substrate with an $SiO_2$ film used as mask and the liquid-phase growth takes place in the recess, a smooth and uniform layer can be obtained only with great difficulty because of the following drawbacks. Namely, due to the anisotropy in the growth velocity and to the unevenness in the supply of the melt or raw material, (1) the GaAs layer 7 extends even over the mask 6, (2) the edge portion of the recess 10 grows rapidly, as shown in FIG. 2, and (3) under certain conditions of epitaxial growth the mouth of the recess is occluded to leave in the recess the melt, which gives rise to a polycrystalline region.

SUMMARY OF THE INVENTION

The object of the present invention is to provide a novel method of producing a GaAs LED of planar type, free from the drawbacks usual with the conventional methods and having a simple structure and an excellent reproducibility.

More concretely, the object of the present invention is to provide a novel method which makes it possible to produce a Si-doped GaAs LED of planar type through the liquid-phase growth technique.

The feature of the method of producing a GaAs LED according to the present invention, is that a recess is cut in one of the principal surfaces of a GaAs substrate, that Si-doped N-type and P-type GaAs layers are formed on the surface of the recess and on the one principal surface of the substrate through the liquid-phase growth technique, and that the grown layers are so cut as to expose a portion or the whole of the end of the PN junction defined between the layers, in the surface almost parallel to the one principal surface of the substrate. As a result of repeated experiments by the inventors, it has been revealed that the reason why a GaAs LED of planar type cannot be easily obtained through the conventional selective epitaxial growth techniques, is that since it is difficult to crystallize the GaAs on the mask of $SiO_2$, the raw material is supplied to excess in the vicinity of the mouth of the recess whereby GaAs crystal rapidly grows near the mouth of the recess. Therefore, if the crystallization of GaAs is caused to take place on the GaAs substrate without a mask, as according to the present invention, the crystallization covers a portion other than the recess so that the supply of the raw material becomes rather uniform to suppress the rapid crystal growth near the mouth of the recess.

More concretely, the feature of the method of producing a GaAs LED according to the present invention is that a recess is cut in one of the principal surfaces of a GaAs substrate, that Si-doped N-type and P-type GaAs layers are formed, while the GaAs substrate is in contact with the Ga melt containing GaAs and Si, on the surface of the recess and on the one principal surface of the substrate by cooling the melt at such a velocity that the melt is not left in the recess, and that the grown GaAs layers are then cut to generate a plane so that the end of the PN junction defined between the GaAs layers are exposed in the plane.

With this method, the mouth of the recess can be prevented from being closed by local crystallization and the Ga melt can also be prevented from being left beneath the grown layer, so that GaAs LED's of planar type can be obtained with high reproducibility. The cooling velocity at which the Ga melt is not confined within the recess, is the value determined by the width (of the narrower side at the mouth) and the depth of the recess, as described later.

BRIEF DESCRIPTION OF THE DRAWINGS

FIG. 9 shows in cross section a luminescent diode fabricated according to the present invention, used for a photocoupler.

FIGS. 10a to 10c show in cross section GaAs substrates used in the embodiments, of the present invention.

DESCRIPTION OF THE PREFERRED EMBODIMENTS

Now, the present invention will be described in detail by way of embodiment with the aid of the attached drawings.

Figure 4:
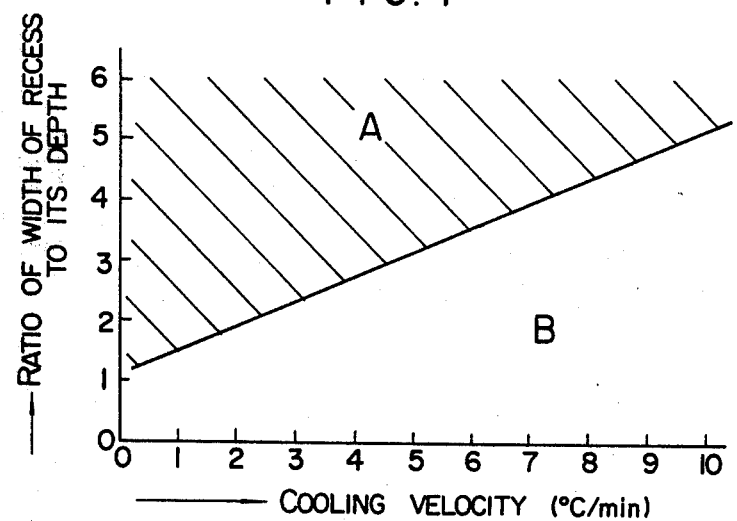
FIG. 4 shows a characteristic curve illustrating the relationship among the cooling velocity at which the Ga melt is not left in the recess, the width of the narrower side of the mouth of the recess and the depth of the recess.

FIGS. 3a to 3d illustrate the steps of the process for producing a GaAs LED according to the present invention. Namely, the method according to the present invention is usually divided into four steps. In the first step (FIG. 3a), a recess 112 is cut in one 111 of the principal surfaces of an N-type GaAs substrate 11. In the second step (FIG. 3b), the GaAs substrate 11 is brought into contact with the Ga melt containing GaAs and Si so that a first Si-doped GaAs layer 12 of N-type and a second Si-doped GaAs layer 13 of P-type are continuously grown in this order mentioned, on the principal surface 111 of the substrate 11 and on the surface of the recess 112. In the third step (FIG. 3c), the thus formed GaAs layers are cut along the broken line to generate a plane almost parallel to the principal surface so that a portion or the whole of the edge of the PN junction J defined between the first and second GaAs layers may be exposed in the plane. In the fourth step (FIG. 3d), a first and a second main electrodes 14 and 15 are formed respectively on the surface of the P-type and the N-type regions on both sides of the PN junction J exposed in the plane. Of these four steps, the first and the second are especially important from a viewpoint of attaining the object of the present invention. Namely, in order to produce GaAs LED's with a high reproducibility, it is necessary to prevent the mouth of the recess 112 from being rapidly closed by the grown layer and to prevent the Ga melt from being confined within the grown layer. For this purpose, the relationship between the ratio $l/d$ of the width $l$ (of the narrower side) of the mouth of the recess 112 to the depth $d$ of the recess and the velocity of cooling the Ga melt, must be appropriately determined. FIG. 4 illustrates such a relationship, and the hatched area A satisfies the relationships between the ratio and the velocity of cooling, for which the melt is prevented from being confined within the grown layer. For the relationships corresponding to the area B, the melt will be confined within the grown layer. It is seen from FIG. 4 that if the width is increased in comparison with the depth, the velocity of cooling the melt can be increased without leaving the melt within the grown layer while for a small width relative to the depth the velocity must be lowered so as not to confine the melt within the grown layer. The reason for this is considered as follows. If the width of the mouth of the recess is large in comparison with the depth, the effect of making uniform the supply of the raw material (e.g. GaAs in the Ga melt) near the mouth of the recess as well as in the recess can be expected. In this case, even if the crystallization of the GaAs depends on the rate of supply of raw material, that is, even when the velocity of cooling the Ga melt is large, the melt is never left behind the grown lid of crystal in the recess. Moreover, if the crystallization of GaAs is changed from the supply-rate dependent type to the reaction-rate dependent type as the velocity decreases, the melt will never be left in the recess, even if the rate of supply of the raw material is rather uneven as the width of the mouth of the recess becomes narrower. It is therefore essential to make the dimensions of the recess and the velocity of cooling at the time of liquid phase growth in the first and second steps belong to the hatched region A in FIG. 4.

Figure 5:
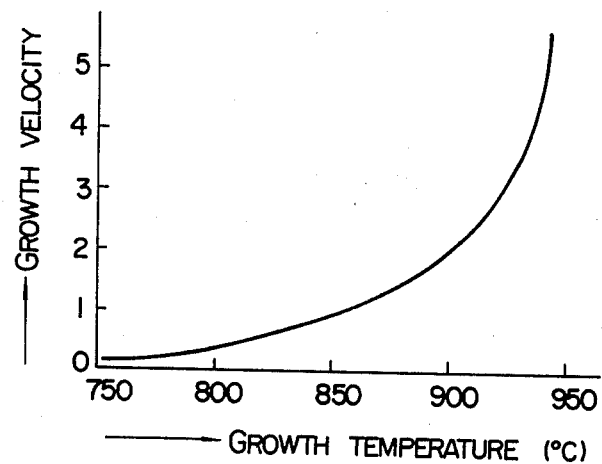
FIG. 5 shows a characteristic curve illustrating the relationship between the growth velocity and the growth temperature, in the liquid-phase growth of GaAs.

On the other hand, since the solubility of GaAs into the Ga melt increases with temperature, the higher the temperature, the greater is the growth velocity. FIG. 5 shows the relationship between the growth temperature and the growth velocity, at a velocity 1.0° C/min. of cooling the Ga melt. As seen from the figure, the growth velocity rapidly rises at temperatures higher than 930° C. If the growth velocity is too great, (1) the supply of raw material into the recess of the substrate is insufficient so that the crystal growth in the recess is retarded, and (2) the grown layer has different thicknesses due to different growth initiating temperatures, so that a diode having a uniform characteristic cannot be obtained in mass production. It is therefore preferable that the growth temperature in the second step should be lower than 930° C.

Figure 6:
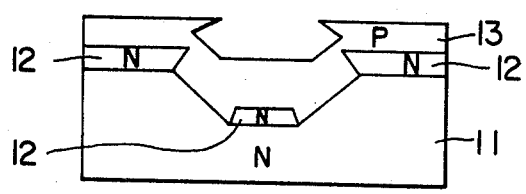
FIG. 6 and FIG. 7 shows in cross section the shapes of liquid-phase-grown layers obtained according to the present invention.

In order to cut the recess 112 in the GaAs substrate 11, the chemical etching method using oxidizing solution containing, for example, hydrogen peroxide is usually employed. It is known that when a recess is formed through this chemical etching method the side surfaces of the recess tend to be a (1 1 1) A plane or to be crystallographically equivalent to the (1 1 1) A plane, due to its characteristic etching velocity. In the liquid phase growth method for Si-doped GaAs, the silicon serves as an amphoteric impurity so that a P-type layer is grown at low temperatures while an N-type layer is formed at higher temperatures. The inversion temperature at which the conductivity type of the grown layers is changed from N to P, depends upon the surface orientation, the concentration of Si in the Ga melt and the cooling velocity. For example, with respect to the surface orientation, the inversion temperature is the highest for (1 1 1) A plane and the lowest for (1 1 1) B plane. Accordingly in FIG. 6, under certain conditions, an N-type layer 12 and a P-type layer 13 can be formed in this order mentioned on the bottom surface of the recess 112 while a P-type layer 13 is grown directly on the side surface of the recess 12. When a P-type layer is directly grown on the substrate 11 to form a PN junction, the number of crystal defects is increased and the uniformity of crystal is lowered in the PN junction region so that the luminescent efficiency in that region is degraded. In such a case, in order to prevent the degradation of the luminescent efficiency of the GaAs LED, it is preferable to make the area of the bottom surface of the recess larger that that of the side surface of the recess.

Figure 7:
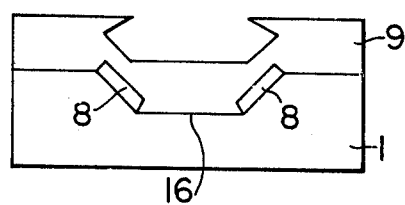

On the other hand, in the case where the vapor phase etching method using such an etchant as hydrogen chloride is employed to cut a recess in a GaAs substrate, the side surfaces of the recess tend to be a (1 1 1 ) B plane or to be crystallographically equivalent to the (1 1 1 ) B plane so that the inversion temperature for the side surfaces is lower than that for the bottom surface. Accordingly in FIG. 7, under certain growth conditions, an N-type layer 8 and a P-type layer 9 can be grown in this order mentioned on the side surfaces of the recess 16 while a P-type layer can be grown directly on the bottom surface. In this case, the area of the side surfaces must be larger than that of the bottom surface in order to prevent the degradation of the luminescent efficiency of the GaAs LED.

Moreover, since the luminescent region of the Si-doped GaAs LED is mainly in the P-type layer and the diffusion length of the minority carriers in the P-type layer is 30 –50 $\mu$, the thickness of the P-type layer should be preferably more than 30 $\mu$. Accordingly, when the depth of the recess cut in the substrate is more than 30 $\mu$, a GaAs LED of planar type having a high luminescent efficiency can be obtained. On the other hand, if the thickness of the P-type layer is too large, there is caused a drawback that the forward voltage drop of the resultant GaAs LED is high due to the resistance of the P-type layer. It is therefore preferable that the thickness of the P-type layer should be less than 150 $\mu$.

Figure 3A:
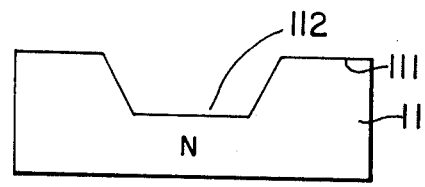
FIGS. 3a to 3d show the steps of a process for producing a GaAs infrared luminescent diode according to the present invention.
Figure 3B:
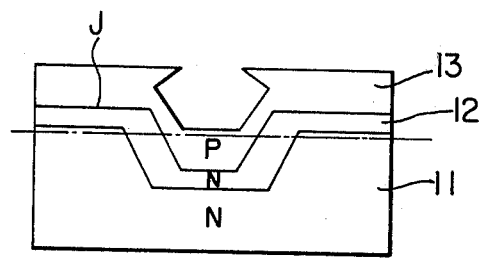
Figure 3C:
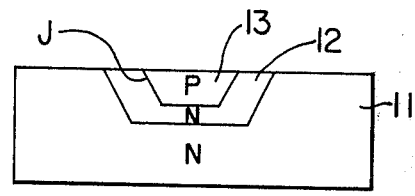
Figure 3D:
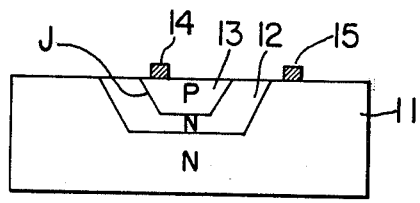

In addition to the conditions described above, the shape of the recess must be such that the side surfaces connecting the bottom surface and the principal surface are slanted or spread toward the principal surface as shown in FIG. 3a, so as to increase the wettability of the Ga melt with respect to the surface of the recess in the liquid phase growth process.

In this specification, the "width of the recess" refers to the distance between the closest pair of sides of the mouth of the recess. In case of a round recess, therefore, the width corresponds to the diameter. When the recess is in the form of a groove, the width of the groove equals the width of the recess.

Now, the method of producing a GaAs LED according to the present invention will be described below by way of embodiments.

EMBODIMENT I

Figure 8:
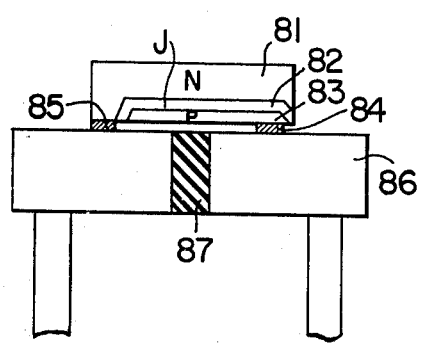
FIG. 8 shows in cross section a luminescent diode fabricated according to the present invention.

Through the photo-etching technique using an etchant composed of sulfuric acid, hydrogen peroxide and water in the proportion of 3 : 1 : 1, a recess having a length 500 $\mu$ in the direction <0 1 1>, a width 250 $\mu$ in the direction <0 1 1> and a depth 50 $\mu$ is formed in the (1 0 0) surface of a GaAs substrate (N-type, 1 – $10^{18}$cm×3) 81 in FIG. 8. After the photoresist film has been removed from the surface of the substrate, the substrate is brought into contact with a gallium melt (containing Ga 20 g, GaAs 3.5 g, Si 0.1 g) at a temperature of 920° C by the use of an ordinary liquid phase growth apparatus. The Ga melt is then cooled at a velocity of 0.5° C/min. down to 700° C and Si-doped N-type and P-type GaAs layers 82 and 83 are grown on the surface of the substrate. The grown layers are so ground and polished as to expose the PN junction J in the polished plane surface, the thickness of the portion removed by grinding being 70 $\mu$. Through the vacuum evaporation method, Au-zn and Au-Ge films or Au-Ge-Ni and Au-Ge films are vapor-deposited respectively on the P-type and N-type layers to form electrodes 84 and 85 and the substrate is scribed into a square pellet of 500 $\mu$ × 500 $\mu$ to be bonded onto a metal stem 86. A reference numeral 87 indicates an insulator.

As described above, since the process of producing a GaAs LED of planar type according to the present invention resembles the conventional process, the steps of the process are simple and a high reproducibility can be achieved. There is no need for wire bonding or beam lead bonding in the electrical wiring of the thus obtained diode, but the face down bonding can be employed so that the process is adaptable for large-scale production and the resultant elements have a high mechanical strength and a high reliability.

Figure 1:
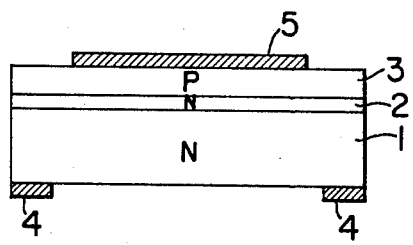
FIG. 1 schematically shows in cross section a conventional GaAs infrared luminescent diode.
Figure 2:
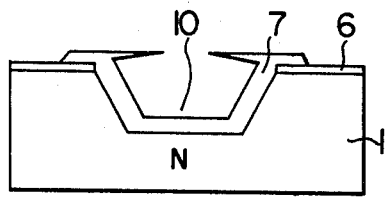
FIG. 2 shows in cross section the shape of the grown layer formed through the conventional selective liquid-phase growth technique.

Moreover, when the planar type GaAs LED according to the present invention is in such a structure that the emitted light is taken out from the substrate side, the light can be radiated out without being interrupted by the electrodes so that the utility factor of the internally generated light is greater in the present GaAs LED than in the conventional GaAs LED as shown in FIG. 1. Further, if the planar type GaAs LED is applied to a photocoupler, as shown in FIG. 9, the distance between the luminescent diode and the light receiving element 90 in the case where the present GaAs LED is used can be rendered shorter than in the case where the diode shown in FIG. 1 is used, since the present GaAs LED has no electrode on the substrate side. Therefore, the coupling efficiency of the photocoupler can be increased.

EMBODIMENT II

Through a method similar to that employed in the first embodiment, a recess having a depth of 50 $\mu$ is formed in the (1 0 0) surface of a GaAs substrate and the liquid phase growth is performed with the substrate in contact with Ga melt at a temperature of 930° C. The table I given below shows the effect of changing the ratio of the width to the depth of the recess and the velocity of cooling the Ga melt, and also shows luminescent efficiency of the planar type GaAs LED's obtained by using the corresponding samples.

Table I

| No. | cooling velocity | recess width recess depth | Is Ga melt left in recess | luminescent efficiency of diode |
|---|---|---|---|---|
| 1 | 0.3° C/min | 1.0 | Yes | — |
| 2 | 0.3° C/min | 1.2 | No | 2.1% |
| 3 | 0.3° C/min | 3.0 | No | 3.8% |
| 4 | 0.3° C/min | 5.0 | No | 4.4% |
| 5 | 1° C/min | 1.0 | Yes | — |
| 6 | 1° C/min | 1.4 | No | 2.7% |
| 7 | 1° C/min | 3.0 | No | 4.1% |
| 8 | 1° C/min | 5.0 | No | 4.5% |
| 9 | 5° C/min | 3.0 | Yes | — |
| 10 | 5° C/min | 3.2 | No | 4.2% |
| 11 | 5° C/min | 6.0 | No | 4.7% |
| 12 | 10° C/min | 5.0 | Yes | — |
| 13 | 10° C/min | 5.3 | No | 4.5% |
| 14 | 10° C/min | 7.0 | No | 4.4% |

(luminescent efficiency is quantum efficiency for conduction current of 10 mA.)

As seen from the Table I, the lower the cooling velocity and the greater the ratio of width to depth, the smaller is the chance of the Ga melt being left in the recess. The luminescent efficiency of a GaAs LED obtained under the condition that no Ga melt is left in the recess, is more than 2% and this is more than twice the value of the luminescent efficiency (below 1%) of the conventional Zn-doped planar type GaAs LED. As is also apparent from the Table I, the luminescent efficiency becomes remarkably high for the ratio of recess width to recess depth, not less than three.

EMBODIMENT III

Through a method similar to that used in the second embodiment, the liquid phase growth is performed with substrates having different recess depths. In this case, the ratio of width to depth equals 4 and the cooling velocity is 1° C/min. The result is shown in the Table II given below.

Table II

| No. | Thickness of P-type layer | Luminescent efficiency |
|---|---|---|
| 15 | 20 $\mu$ | 2.2% |
| 16 | 30 $\mu$ | 3.7% |
| 17 | 80 $\mu$ | 4.4% |
| 18 | 150 $\mu$ | 4.0% |
| 19 | 200 $\mu$ | 2.8% |

It is seen from the Table II that the luminescent efficiency is conspicuously high when the P-type layer has a thickness of 30–150 $\mu$.

EMBODIMENT IV

By the use of an etchant composed of 1 mol NaOH and 0.7 mol $H_2O_2$, recesses are cut in GaAs substrates; a first GaAs substrate with a recess having a width of 200 $\mu$ and running in the direction $<0\ \bar{1}\ 1>$ in the (1 0 0) plane of the substrate, a second GaAs substrate with a recess having a width of 200 $\mu$ and running in the direction $<0\ 1\ 1>$ in the (1 0 0) plane of the substrate and a third GaAs substrate with a recess having a width of 200 $\mu$ and running in the direction $<1\ \bar{1}\ 0>$ in the (1 1 1) B plane of the substrate, and these substrates are then subjected to liquid phase growth. FIGS. 10a to 10c show the thus prepared substrates. The etching speed of the etchant containing NaOH and $H_2O_2$ depends upon the rate of reaction of the etchant on the substrate and has a conspicuous anisotropy. For this reason the side surfaces of the recesses are crystallographically determined. The greatest depth is 140 $\mu$, 170 $\mu$ and 90 $\mu$ for the substrates shown in FIGS. 10a, 10b and 10c, respectively. These substrates are brought into contact with a Ga melt having the same composition and the same temperature as in the embodiment I and the melt is cooled at a velocity of 0.02° C/min down to 700° C to grow Si-doped GaAs layers on the substrates. By grinding and polishing the surfaces of the grown layers, planar type GaAs LED's have been prepared. Since the recess of the sample shown in FIG. 10b has such a shape that its width increases toward the bottom it is suspected that the Ga melt is left in the recess. But, in fact, the speed of crystal growth is lower on the (1 1 1) A plane than on the bottom surface so that the Ga melt is never left in the recess if the condition represented by the hatched area in FIG. 3 is satisfied.

As described above, according to the method of producing a GaAs LED embodying the present invention, a GaAs LED similar in structure and production process to the conventional one, having a high reproducibility and a high luminescent efficiency can be easily obtained.

We claim:
1. A method of producing an infrared luminescent diode using gallium arsenide, comprising
a first step of forming a recess in one of the principal surfaces of a GaAs substrate;
a second step of growing a first Si-doped N-type GaAs layer and a second Si-doped P-type GaAs layer continuously on said one principal surface of said substrate and on the surface of said recess by bringing said substrate into contact with a Ga melt containing GaAS and Si;
a third step of cutting the surfaces of said GaAs layers formed in said second step so as to generate a plane almost parallel to said one principal surface of said substrate so that at least a portion of the edge of the PN junction formed between said first and second GaAs layers can be exposed in said plane; and
a fourth step of bringing a first and a second electrodes in ohmic contact with the portions respectively of said first and second layers on both sides of said edge of said PN junction in said plane where said PN junction is exposed.

2. A method of producing a GaAs luminescent diode, as claimed in claim 1, wherein said first and second GaAs layers are formed while the relationship between the ratio of the width of the mouth of said recess to the depth of said recess and the velocity of cooling said Ga melt, is within the hatched area shown in FIG. 4.

3. A method of producing a GaAs luminescent diode as claimed in claim 1, wherein said first and second GaAs layers are formed while the ratio of the width of the mouth of said recess to the depth of said recess is more than 3 and the velocity of cooling said Ga melt is within the hatched area shown in FIG. 4.

4. A method of producing a GaAs luminescent diode as claimed in claim 1, wherein the thickness of said second GaAs layer is within a range of 30– 150 $\mu$.

5. A method of producing a GaAs luminescent diode as claimed in claim 1, wherein the side surfaces of said recess connecting the bottom surface of said recess and said one principal surface of said substrate spread from the bottom toward the mouth said recess.

* * * * *